(12) United States Patent
Van Elp et al.

(10) Patent No.: US 6,678,037 B2
(45) Date of Patent: Jan. 13, 2004

(54) LITHOGRAPHIC APPARATUS, DEVICE MANUFACTURING METHOD, AND DEVICE MANUFACTURED THEREBY

(75) Inventors: Jan Van Elp, Delft (NL); Martinus Hendrikus Antonius Leenders, Rotterdam (NL); Vadim Yevgenyevich Banine, Helmond (NL); Hugo Matthieu Visser, Utrecht (NL); Levinus Pieter Bakker, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 138 days.

(21) Appl. No.: 09/971,769

(22) Filed: Oct. 9, 2001

(65) Prior Publication Data

US 2002/0097385 A1 Jul. 25, 2002

(30) Foreign Application Priority Data

Oct. 10, 2000 (EP) ............................. 00308903

(51) Int. Cl.$^7$ ......................... G03B 27/54; G03B 27/42; G03B 27/72
(52) U.S. Cl. ................ 355/67; 355/71; 355/53
(58) Field of Search ................... 355/30, 53, 67–71; 250/548; 356/399–401

(56) References Cited

U.S. PATENT DOCUMENTS

| | | | |
|---|---|---|---|
| 4,771,180 A | * 9/1988 | Nomura et al. | 250/548 |
| 5,359,388 A | * 10/1994 | Hollman | 355/53 |
| 5,999,247 A | * 12/1999 | Tezuka | 355/71 |
| 6,020,950 A | * 2/2000 | Shiraishi | 355/30 |

* cited by examiner

Primary Examiner—Henry Hung Nguyen
(74) Attorney, Agent, or Firm—Pillsbury Winthrop LLP

(57) ABSTRACT

In a lithographic projection apparatus, a grating spectral filter is used to filter an EUV projection beam. The grating spectral filter is preferably a blazed, grazing incidence, reflective grating. Cooling channels may be provided in or on the rear of the grating spectral filter. The grating spectral filter may be formed of a material effectively invisible to the desired radiation.

23 Claims, 3 Drawing Sheets

LITHOGRAPHIC APPARATUS, DEVICE MANUFACTURING METHOD, AND DEVICE MANUFACTURED THEREBY

BACKGROUND OF THE INVENTION

This application claims priority to European Patent Application 00308903.4, filed Oct. 10, 2000 which is herein incorporated by reference in its entirety.

1. Field of the Invention

The present invention relates generally to a lithographic projection apparatus and more particularly to a lithographic projection apparatus including a spectral filter.

2. Background of the Related Art

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include, for instance, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc SPIE 3997, pp. 136–156, 2000; M. W. McGeoch, "Power Scaling of a Z-pinch Extreme Ultraviolet Source", Proc SPIE 3997, pp. 861–866, 2000; and W. T. Silfvast, M. Klosner, G. Shimkaveg, H. Bender, G. Kubiak, N. Fornaciari, "High-power plasma discharge source at 13.5 and 11.4 nm for EUV lithography", Proc SPIE 3676, pp. 272–275, 1999.

Some extreme ultraviolet sources, especially plasma sources, emit radiation over a wide range of frequencies, even including infrared (IR), visible, ultraviolet (UV) and deep ultraviolet. These unwanted frequencies will propagate and cause heating problems in the illumination and projection systems and cause unwanted exposure of the resist if not blocked; although the multilayer mirrors of the illumination and projection systems are optimized for reflection of the desired wavelength, e.g. 13 nm, they are optically flat and have quite high reflectivities at IR, visible and UV wavelengths. It is therefore necessary to select from the source a relatively narrow band of frequencies for the projection beam. Even where the source has a relatively narrow emission line, it is necessary to reject radiation out of that line, especially at longer wavelengths. It has been proposed to use a thin membrane as a filter to perform this function. However, such a film is very delicate and becomes very hot, 200–300° C. or more, leading to high thermal stresses and cracking, sublimation and oxidation in the high power levels necessary in a lithographic projection apparatus. A membrane filter also generally absorbs at least 50% of the desired radiation.

SUMMARY OF THE INVENTION

One aspect of an embodiment of the present invention provides an improved filter that may be used in a lithographic projection apparatus to select a relatively narrow band of wavelengths from a wide band source or to reject unwanted frequencies.

According to the present invention there is provided a lithographic projection apparatus including a radiation system to provide a projection beam of radiation, a support structure to support patterning structure, the patterning structure serving to pattern the projection beam according to a desired pattern, a substrate table for holding a substrate, a projection system to project the patterned beam onto a target portion of the substrate, and a grating spectral filter comprised in said radiation system for passing radiation of desired wavelengths to form said projection beam and for deflecting radiation of undesired wavelengths. Embodiments of the grating spectral filter of the present invention are more efficient, directing a higher proportion of the desired radiation into the projection beam, and more robust than membrane filters used in the prior art. In particular, certain embodiments of the grating spectral filter are less prone to thermal radiation because they can reflect rather than absorb the undesired radiation, because they can be made thicker and because cooling channels can be integrated or attached to a rear surface thereof. By suitable selection of parameters of the grating filter, such as the line density and angle of the incident beam, the resolving power, which determines the wavelength band passed into the projection beam, can be adjusted as desired. Further, a reflective, grazing incidence grating filter of the size necessitated by the beam diameter can be provided more easily than a transmissive filter.

The grating spectral filter is preferably a blazed grating because such gratings have a high diffraction efficiency. For maximum reflection efficiency, the grating is preferably used at grazing incidence. A laminar grating with a square wave surface profile may also be used and can be cheaply manufactured.

Aspects of embodiments of the present invention also provide a device manufacturing method comprising providing a substrate that is at least partially covered by a layer of radiation-sensitive material, providing a projection beam of radiation using a radiation system, using patterning structure to endow the projection beam with a pattern in its cross-section, projecting the patterned beam of radiation onto a target portion of the layer of radiation-sensitive material, and filtering said projection beam in said radiation system using a grating spectral filter.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet radiation (e.g., with a wavelength of 365, 248, 193, 157 or 126 nm) and extreme ultra-violet (UV) radiation (e.g., having a wavelength in the range 5–20 nm).

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION OF EMBODIMENTS OF THE INVENTION

Embodiment 1

Figure 1:
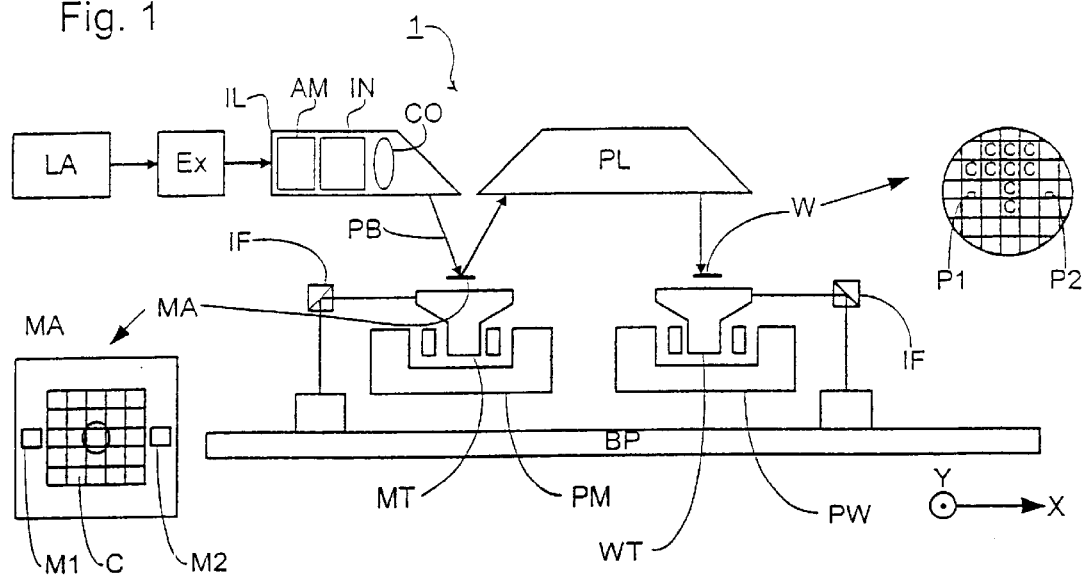
FIG. 1 depicts a lithographic projection apparatus according to a first embodiment of the invention.

FIG. 1 schematically depicts a lithographic projection apparatus according to a particular embodiment of the invention. The apparatus includes:

- a radiation system Ex, IL, for supplying a projection beam PB of radiation (e.g., EUV radiation), which in this particular case also comprises a radiation source LA;
- a first object table (mask table) MT provided with a mask holder for holding a mask MA (e.g., a reticle), and connected to first positioning means PM for accurately positioning the mask with respect to item PL;
- a second object table (substrate table) WT provided with a substrate holder for holding a substrate W (e.g., a resist-coated silicon wafer), and connected to second positioning means PW for accurately positioning the substrate with respect to item PL;
- a projection system ("lens") PL (e.g., a mirror group) for imaging an irradiated portion of the mask MA onto a target portion C (e.g., comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g., a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB using wafer alignment marks P1, P2. Similarly, the first positioning means can be used to accurately position the mask MA using mask alignment marks M1, M2 with respect to the path of the beam PB, e.g., after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e., a single "flash")onto a target portion C. The substrate table WT is then shifted in the x and/or y directions so that a different target portion C can be irradiated by the beam PB.

In scan mode, essentially the same scenario applies, except that a given target portion C is not exposed in a single "flash." Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

To remove unwanted wavelengths from the output of the radiation source, a spectral grating filter 100 is placed in the illumination system, conveniently near the source to minimize heat to and in the remainder of the system but at the earliest stage where the filter can be situated in either a converging or diverging beam. The opening angle of the beam should be limited to have the sufficient wavelength selectivity. The grating filter may be a reflective grating that will diffract incident radiation at an angle dependent on wavelength. The grating filter 100 is arranged so that the desired radiation enters the remainder of the illumination system while the unwanted radiation is diffracted at different angles and absorbed by beam blockers.

Figure 2:
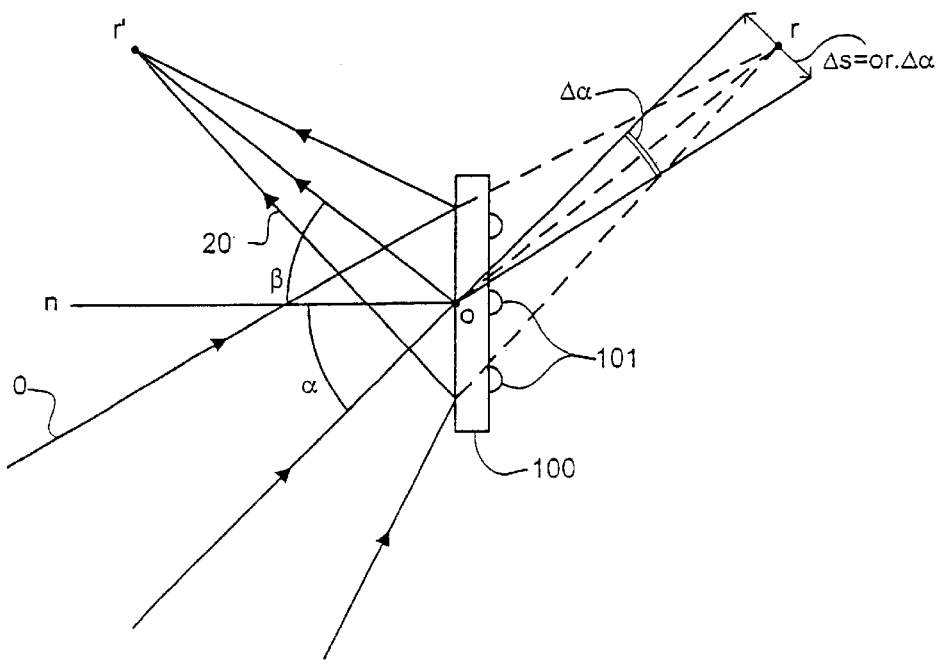
FIG. 2 is a diagram used to explain the principle of the present invention.

FIG. 2 shows a possible arrangement of the grating filter with a converging beam 10. In the absence of the grating it would be focused on a point behind the grating. It is now incident on the grating under an angle α and the virtual source point is at a distance or behind the grating. Radiation of the desired wavelength is diffracted into an angle β into the diffracted beam 20 and converges at a distance or' from the grating. This point can be on the mask but can also be a point on a plane in the illumination system from which another optical element would focus the beam on the mask.

Figure 3:
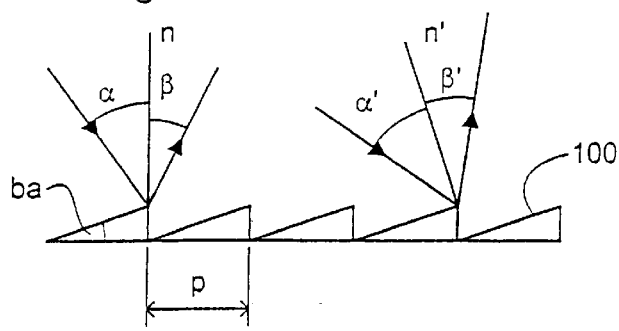
FIG. 3 is a schematic illustration of a blazed grating useable in the invention.

The grating may be a blazed grating, such as shown in FIG. 3. A blazed grating has a sawtooth profile with the grating constant, p, equal to the width of a period of the sawtooth. The blaze angle ba can be chosen such that the reflection as compared to the sawtooth profile is mirror-like, i.e., the incident and reflected angles α', β' measured from the normal n' to the sawtooth profile are equal. With such an arrangement, a diffraction efficiency of 100% is theoretically possible. A suitable grating of this type is described by Franke et al, J. Vac. Sci. Technol. B 15, p2940 (1997), incorporated herein by reference, and has a diffraction efficiency of 80% and overall efficiency of about 65% taking into account 80% grazing incidence reflection efficiency.

Assuming an acceptance angle $\Delta\alpha=0.5°$, equivalent to a spot size of 4 mm a distance of 458 mm from the grating, and a desired radiation wavelength of 13.5 nm possible arrangements are set out in Table 1 below:

| Line Density (lines/mm) | Blaze angle, ba | α | β | λ/Δλ | λcutoff (nm) |
|---|---|---|---|---|---|
| 300 | 1.5 | 87.063 | −84.063 | ~9 | 14.966 |
| 300 | 2.0 | 88.674 | −84.674 | ~20 | 14.144 |
| 400 | 1.5 | 85.58 | −82.58 | ~8 | 15.166 |
| 400 | 2.0 | 87.563 | −83.563 | ~14.5 | 14.407 |
| 600 | 1.5 | 82.6 | −79.6 | ~7.2 | 15.366 |
| 600 | 2.0 | 85.366 | −81.336 | ~11.4 | 14.671 |

Figure 5:
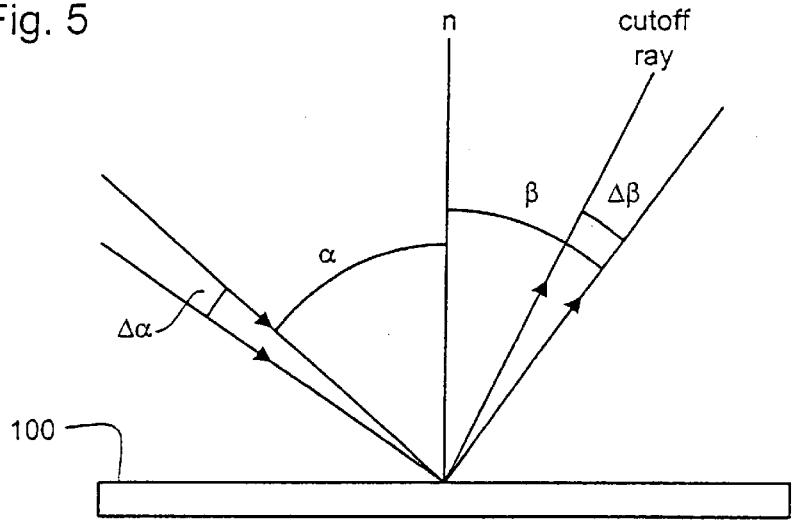
FIG. 5 is a diagram used to explain the cut-off wavelength of a grating filter according to the invention.

The values for β are based on the convention that negative angles ate the other side of the normal, n, than α. The cutoff value, λcutoff, is not exact but based on the acceptance angle Δα; the longest wavelength ray that will be accepted is that with angles $\alpha+\Delta\alpha/2$ and $\beta+\Delta\beta/2$, as shown in FIG. 5, from which the cutoff wavelength is determined using the grating equation.

The resolving power, $\lambda/\Delta\lambda$, of the grating derives from five contributions. Firstly and secondly, the contributions from the entrance and exit slits:

$$\frac{\Delta\lambda}{\lambda} = \frac{\Delta\alpha \cdot \cos\alpha}{Nk\lambda} \quad (1)$$

and $$\frac{\Delta\lambda}{\lambda} = \frac{\Delta\beta \cdot \cos\beta}{Nk\lambda} \quad (2)$$

derived from $Nk\lambda=\sin\alpha+\sin\beta$, where N is the line density and k is the order, 1 in the present case. The contribution from Δα is included in Table 1 above.

The third contribution is dependent on the number of lines illuminated and can be neglected in the present application as the number of lines illuminated is very large. The fourth and fifth contributions are dependent on optical aberrations in the system and imperfections in the optical surface of the grating. A suitably high quality system can be selected so that these contributions can be neglected. The total resolution is then the combination of the contributions from the entrance and exit slits and will be √2 times that shown in Table 1 if both contributions are equal.

Figure 4:
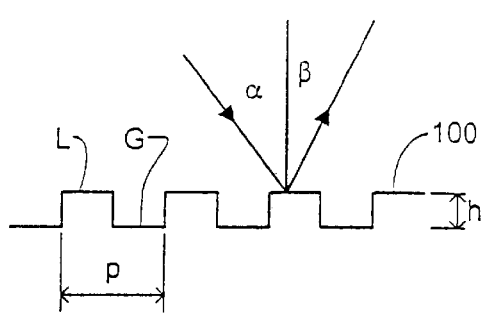
FIG. 4 is a schematic illustration of a laminar grating useable in the invention.

As an alternative to the blazed grating, a laminar grating of the type shown in FIG. 4 may be used. As shown in FIG. 4, the laminar grating has a square wave surface profile with the grating constant, d, equal to one period of the square wave. Such a grating can easily be made, e.g. using holographic lithography techniques. In such a technique, the upper surface is polished to a very good surface roughness and grooves are etched with the lands defined by a photoresist pattern. Gratings commercially available form a variety of sources are suitable and can provide a maximum diffraction efficiency of about 40%.

To cool the mirror in use, cooling channels 101 can be provided on the rear surface of the grating, as shown in FIG. 2, or incorporated in the body of the grating. A suitable coolant fluid is passed through the cooling channels 101 to maintain the mirror at the desired temperature. The grating 100 can be made as thick as required, e.g. of order 50 mm, for the desired mechanical properties and physical robustness required in use.

Laser-produced plasma sources as well as plasma discharge sources emit a stream of fast ions and atoms in addition to the desired radiation. When a membrane is used for wavelength filtering, it also functions to block the ions and atoms. The grating filter of the present invention is advantageously combined with a gas-based system for blocking the ions and atoms. This combination allows the debris and radiation filtering to be carried out close to the radiation source, minimizing contamination and heating in the illumination system.

Embodiment 2

In a second embodiment of the invention, which may be the same as the first embodiment of the invention save as described below, the grating is positioned in a diverging beam so there is a real object and virtual image. Using a constant line spacing grating, the distances or and or', the distances from the grating to the object and image, are different. In both the first and second embodiments, a grating with a variable line spacing can be used to alter these distances and make them equal in which case the grating has almost the same properties as a plane mirror. The gratings of both the first and second embodiments can be combined with another reflector, e.g. a scatter plate or spherical focusing mirror, included in the illumination system to have a combined function.

Embodiment 3

In a third embodiment of the invention, which may be the same as the first or second embodiments save as described below, a grating structure is applied to a grazing incidence mirror in the illumination system.

Figure 6:
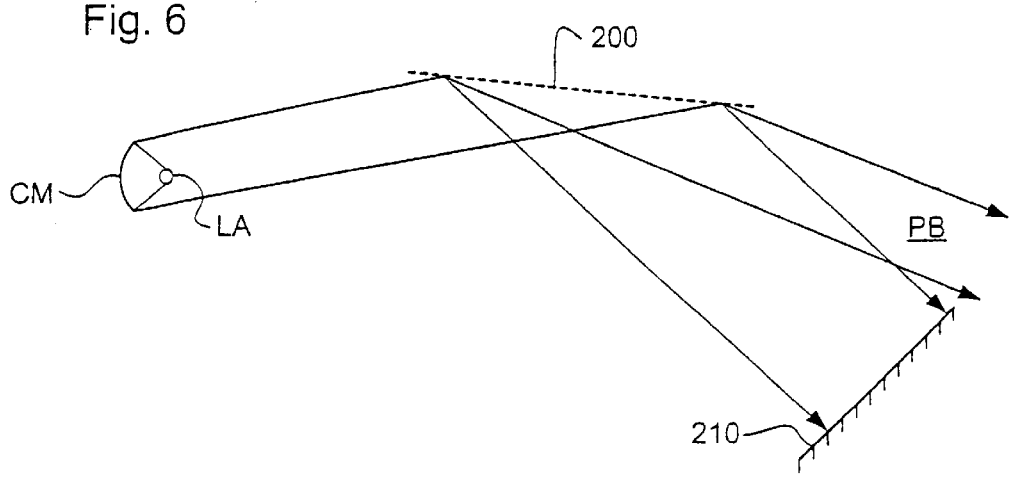
FIG. 6 is a diagram of part of an illumination system according to a third embodiment of the invention.

As shown in FIG. 6, radiation from radiation source LA is collected by collector mirror CM and directed towards grazing incidence reflector 200. The beam directed towards reflector 200 contains both the desired EUV radiation, e.g. at a wavelength of about 13.5 nm, and undesired radiation at higher wavelengths. If the source LA is, for example, a laser-produced xenon-plasma, there may be of the order of 10 times as much energy in the UV radiation band of 100–200 nm as in the desired EUV band around 13.5 nm.

To extract the unwanted longer-wavelength radiation, a diffraction grating structure, such as consisting of a phase grating as shown in FIG. 4, is applied to the reflector 200. The grating is arranged so that the optical path difference (OPD) between rays having been reflected by the "land" L and "groove" G parts of the grating is an integer multiple of the wavelength of the desired wavelength, i.e., $$OPD = n \cdot \lambda_{euv} \quad (3)$$

where n is an integer and $\lambda_{euv}$ the wavelength of the desired radiation, e.g. 13.5 nm. At the same time, the OPD for the above rays is chosen to be an integer multiple plus half a wavelength in an undesired radiation range, i.e.

$$OPD = (m+\tfrac{1}{2}) \cdot \lambda_{ud} \quad (4)$$

where m is an integer and $\lambda_{ud}$ the wavelength of the undesired wavelength.

By satisfying equation (3), the grating does not disturb the desired radiation which is reflected as intended by reflector 200, effectively all desired radiation is diffracted into the $0^{th}$ order beam. However, the undesired radiation is diffracted as determined by the grating equation and for wavelengths for which equation (4) is exactly satisfied the diffraction efficiency is at a maximum with all energy diffracted out of the $0^{th}$ order beam. In this way, the undesired radiation is spatially separated from the desired radiation forming projection beam PB and can be absorbed by a suitable heat sink or beam dump 210.

As an example, the diffractive structure can form a phase grating, as shown in FIG. 4, with 50% duty cycle, depth h and period p of the order of $100 \cdot \lambda_{euv}$. The depth h is chosen such that the OPD, given by:

$$OPD = 2h \cdot \sin(\alpha) \tag{5}$$

where $\alpha$ is the grazing incidence angle, is 67.5 nm. For a grazing angle $\alpha=15°$, d is 130 nm, which can be accurately realized. With such a grating, $OPD=5 \cdot \lambda_{euv}$ for $\lambda_{euv}=13.5$ nm so that all the desired radiation goes into the $0^{th}$-order beam. For radiation at 135 nm, $OPD=\frac{1}{2} \cdot \lambda_{ud}$ so that substantially no radiation around this wavelength goes into the $0^{th}$-order beam and the maximum energy at undesired wavelength is separated from the desired radiation.

It should be noted that any imperfection in the grating height, e.g. due to manufacturing tolerances may reduce the amount of desired radiation going into the $0^{th}$-order beam but will not cause significant undesired energy to go into the $0^{th}$-order beam. Any losses in the desired radiation going into the $0^{th}$-order beam will still be much less than the losses resulting from a metallic absorption filter.

Embodiment 4

The fourth embodiment is similar to the third embodiment, but the grating applied to the mirror is constructed from a material having a refractive index close to that of the medium through which the projection beam travels before it is incident on the grating. For EUV with an evacuated radiation system, the complex refractive index should have a real part unity and a small imaginary part (low absorption) at the desired wavelength but a refractive index substantially different from unity at other wavelengths.

For EUV at 13.5 nm, silicon can be used to form the diffractive structure as its complex refractive index at that wavelength is given by:

$$n = 0.9993 - 0.0018j.$$

Figure 7:
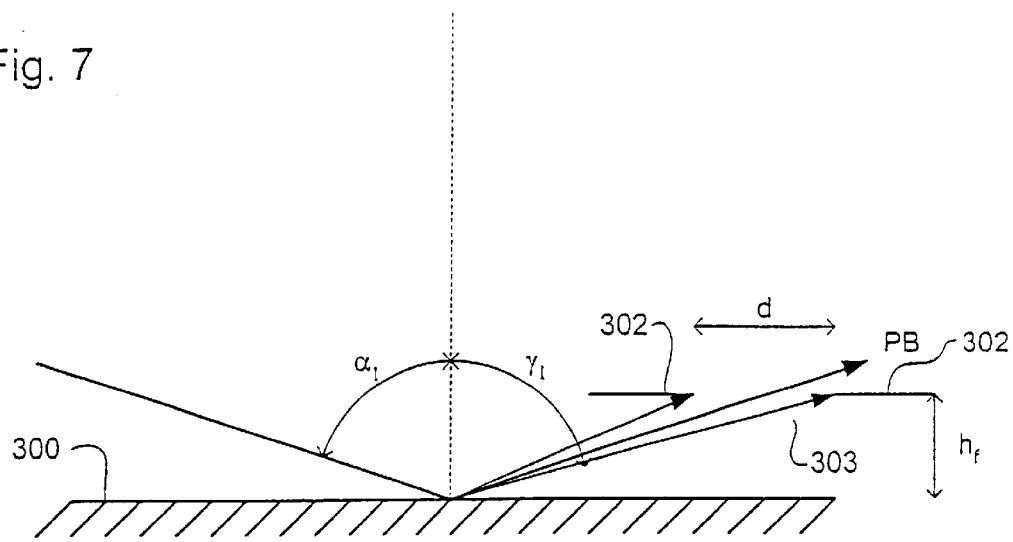
FIG. 7 is a diagram of a filter according to a fourth embodiment of the invention.
Figure 8:
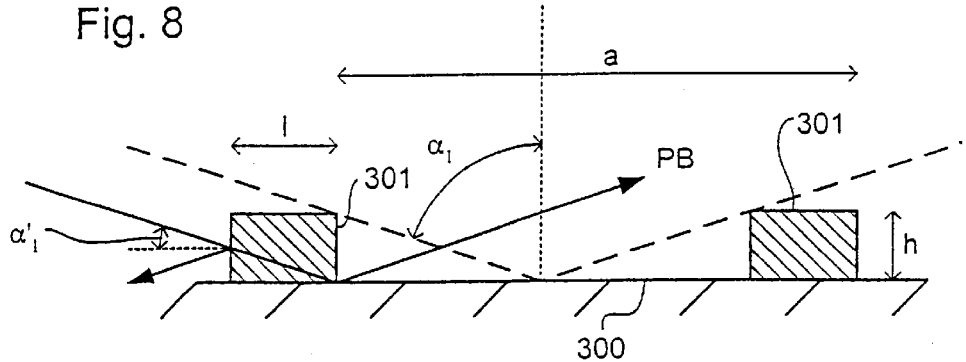
FIG. 8 is an enlarged diagram of part of the filter of FIG. 7.

FIGS. 7 and 8, which is an enlargement of part of FIG. 7, show a diffractive structure comprising protrusions of silicon deposited on a grazing incidence (GI) mirror 300. The EUV radiation at 13.5 nm is essentially unaffected by the diffractive structure 301 and reflects normally to form the projection beam PB. The unwanted radiation is diffracted by the diffractive structure 301 and blocked by spatial filter 302.

As best shown in FIG. 8, the diffractive structure is constructed so that the desired radiation PB only passes one period of the diffractive structure. The angle of incidence of the projection beam with a side surface of the diffractive structure is shown as $\alpha'_1$. This angle should remain small to minimize reflection of the projection beam by a capping layer provided on the silicon diffractive structure 301 since cap layer materials tend to have a high reflectivity for grazing incidence angles. Also, the upper surface of the protrusions of the diffractive structure can be angled, as in a blazed grating, so that the $0^{th}$-order of the unwanted radiation is directed in a different direction than the desired radiation. Further, a material with a poor grazing reflectivity (high transmission) property for the desired radiation is preferred for the capping layer. Where the desired radiation is EUV, carbon is suitable.

The effectiveness of the diffractive structure can be derived as discussed below.

The maxima of the diffracted spectrum can be calculated using:

$$a(\sin \gamma - \sin \alpha) = m\lambda, \tag{6}$$

where a is the period of the diffractive structure, m is the order of the maximum, and $\alpha$, and $\gamma$ are the angles of the incoming and the diffracted beam with respect to the normal of the mirror 300 (not with respect to the diffractive structure), respectively. We note that expression (6) is independent of the exact structure of the diffractive structure.

As an example (for illustrative purposes only), we take a=2000 nm, $\alpha_1=85°$, $h_f=10$ mm, d=20 mm, and l—150 nm, where d is the width of the opening aperture in spatial filter 302, $h_f$ is the distance between the diffractive structure and spatial filter 302, and l is the width of a protrusion of the diffractive structure. In order to lose the diffracted light (except for the $0^{th}$-order), the light has to be deflected more than the beam 303 in FIG. 7 which is incident on the edge of the opening aperture of spatial filter 302. For the deflected beam 303, the following expression holds:

$$\gamma_1 = \arctan\left(\frac{d}{2h_f} + \tan\alpha_1\right) = 85.4°. \tag{7}$$

Combining this expression with expression (6), we can calculate the minimum wavelength of the radiation that would be deflected more than beam 303 in FIG. 1:

$$\lambda_1 = 1.2 \text{ nm}.$$

So we can conclude that for a reflection phase grating with a pitch of 2000 nm, radiation with a wavelength larger than 1.2 nm will be suppressed by the spatial filter, provided the grating structure is "visible" to that radiation. However, the grating structure is not visible to the desired radiation because it is made of a material selected to have a refractive index close to the vacuum value at the relevant wavelengths.

The height h of the protrusions can be calculated using:

$$h = \frac{a - l}{2 \tan \alpha_1} = 81 \text{ nm}. \tag{8}$$

The maximum path length of the beam in the notch, $l_{max}$ is:

$$l_{max} = \frac{l}{\cos\alpha_1} = \frac{l}{\sin\alpha_1} = 151 \text{ nm}. \tag{9}$$

The influence of the protrusion structure on the desired, e.g. EUV, reflection can be calculated by comparing the transmission of the protrusion at different positions within a period. The transmission of a silicon layer of thickness $d_{Si}$ is:

$$t = \exp - \frac{d_{Si}}{\mu} \tag{10}$$

where $\mu$ is the attenuation length of 13.5 nm EUV radiation in silicon (588.2 nm). The maximum absorption in a rectangular protrusion structure is:

$$\chi_A = 1 - \exp\left(-\frac{l_{max}}{\mu}\right). \tag{11}$$

For the structure as given above, this absorption is equal to 23%. For a horizontal protrusion top surface, the fraction of the incident radiation that hits the top of the protrusion is equal to l/a=7.5%. At maximum 2l/a=15% of the EUV radiation will be lost by diffraction, assuming the radiation impinging on the top surface is totally reflected, and out of phase in the direction of the specular reflection at the mirror surface. So the maximum loss by diffraction is:

$$\chi_d = \frac{2l}{a}. \tag{12}$$

The total specular reflection for EUV radiation of the mirror including the diffractive structure is:

$$R = R_{GI} \cdot (1-\chi_A) \cdot (1-\chi_d). \tag{13}$$

For a mirror 300 with a 1 nm rms roughness ruthenium layer with the diffractive structure as given above, the minimum transmission will be in the order of 61% for the desired EUV radiation.

Note that the surface roughness of the diffractive structure should be low in order to have a low stray light level. However, the toughness criterion is less stringent then for the multilayer mirror surface and grazing incidence mirror surfaces. It is comparable to the roughness criterion of EUV filters. This is the main advantage of the diffracted structure made of an EUV invisible material, compared to other spectral purity filters.

When a converging beam is reflected on the GI mirror, the calculation as given above should be carried out for the lowest incident angle $\alpha_1$ (highest grazing angle). It is possible that a ray passes more than one notch, resulting in less transmission. As an example, we take a=1000 nm, $\alpha_1$—70°, and l—150 nm. Then h—155 nm. For incident angles in the range 70–85°, the average reflection coefficient is 82%, the average transmission of the protrusions is 73% (angles above 82° are transmitted through 2 notches). The top surfaces are assumed to be tilted to an angle parallel to the average incident angle (77.5°). Then the average effective top surface width is 59 nm, resulting in a loss of 12%. The total average transmission is 53%.

The diffractive structure on the mirror can be produced by ruling with a diamond tool. It is also possible to produce the diffractive structure by ion etching of a sinusoidal structure. Producing a block structure on a GI-mirror using lithographic techniques, with subsequent ion etching is also a viable option. The structure as shown in FIGS. 7 and 8 is given as an example; other structures are also possible, provided the absorption of EUV radiation is small (path length $l_{max}$ small), and that there is sufficient suppression of the $0^{th}$-order for non-EUV radiation, and minimum diffraction of EUV radiation.

Embodiment 5

A fifth embodiment of the present invention is similar to the fourth embodiment but the "invisible" diffractive structure is applied to a multilayer mirror 400.

Figure 9:
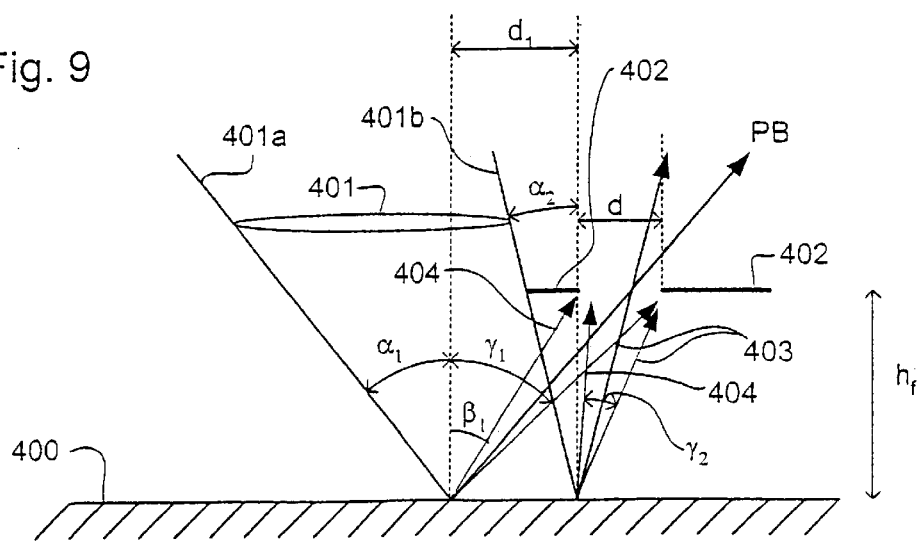
FIG. 9 is a diagram of a filter according to a fifth embodiment of the invention.

FIG. 9 shows a converging beam 401 incident on a multilayer mirror 400 which reflects desired radiation, e.g., EUV at 13.5 nm, to form projection beam PB. The multilayer mirror is optimized for reflection of desired radiation incident at angles between $\alpha$ and $\alpha_2$. A diffractive structure that has no effect on the desired radiation, i.e., is substantially "invisible" to that radiation, is deposited on the mirror. As in the fourth embodiment this may be formed from silicon where the desired radiation is EUV.

The diffractive structure diffracts the undesired radiation into beams 403 away from the desired radiation which are then blocked by spatial filter 402. By giving the diffractive structure a blazed profile, both the $0^{th}$-order and higher orders of the undesired wavelength can be diffracted away from the desired radiation.

The effectiveness of the diffractive structure can be demonstrated as follows and is given for illustrative purposes only:

The maxima of the diffracted spectrum can be calculated using expression (6). As an example, we take a=500 nm, $\alpha_1$=20°, $\alpha_2$=6°, $h_f$=100 mm, d=20 mm and $d_1$=d=20 mm, where distance $d_1$ as indicated in FIG. 9, is taken identically to the width d for simplicity. In order to lose the diffracted light (except for the $0^{th}$-order), the light has to be deflected more than $\gamma_1$ and $\gamma_2$ in FIG. 9. For the deflected beams 403, the following expressions hold:

$$\gamma_1 = \arctan\frac{2d}{h_f} = 21.8°, \tag{14}$$

and $$\gamma_2 = \arctan\frac{d}{h_f} = 11.3°. \tag{15}$$

Using these expressions, and combining them with expression (6), we can calculate the minimum wavelength of the radiation that is deflected more than $\gamma_1$ and $\gamma_2$ in FIG. 1:

$\lambda_1$=1.47 nm $\lambda_2$=4.58 nm

So we can conclude that for a reflection phase grating with a pitch of 500 nm, radiation with a wavelength of more than 45.8 nm will be suppressed by the spatial filter.

The $0^{th}$-order is suppressed by for instance choosing a wedge shape for the diffractive structure. With a wedge shaped structure, the position of the specular reflection of the diffractive structure can be changed independently of the first and higher orders. The following expressions hold for the beams 404 in FIG. 9.

$$\beta_1 = \arctan\frac{d}{h_f} = 11.3°, \tag{16}$$

and $$\beta_2 = \arctan\frac{0}{h_f} = 0°. \tag{17}$$

The $0^{th}$-order has to be deflected at least 20°–11.3°8.7° for the first ray 401a and 6°–0°=6° for the second ray 401b towards the normal to the surface of mirror 400 in FIG. 9. Therefore, a blaze angle ba of 8.7°/2=4.4° is enough to achieve sufficient suppression of the $0^{th}$-order. A blazed grating having a blaze angle ba is shown in FIG. 3.

These calculations are based on a converging beam with a negligible focal diameter. For a real beam the blaze angle should be somewhat higher, and the pitch somewhat smaller.

The influence of the wedge structure on the desired, e.g. EUV, reflection can be calculated by comparing the transmission of the wedge structure at different positions within a period. The amplitude modulation depth induced by the wedge shaped structure is:

$$\chi = 1 - \exp\left(-\frac{2a\tan\theta}{\mu}\right). \tag{18}$$

For the structure as given above, this modulation depth is equal to 12.2%. The radiation at the surface of the wedges can be divided into an oscillating part, and a constant component. The constant component $(1-\chi)$ will result in specular reflection. The oscillating component $\chi$ will be diffracted and lost. The absorption in the diffractive structure is:

$$A = 1 - \frac{1}{a}\int_0^a \exp\left(-\frac{2x\tan\theta}{\mu}\right)dx = 1 - \frac{\mu}{2a\tan\theta}\left[1 - \exp\left(-\frac{2a\tan\theta}{\mu}\right)\right]. \quad (19)$$

For the structure as given above, this absorption is equal to 6.3%.

The total specular reflection for EUV radiation of the mirror including the diffractive structure is:

$$R = R_{ML}(1-\chi). \quad (20)$$

Note that the surface roughness of the diffractive structure should be low in order to have a low stray light level. However, the roughness criterion is less stringent than for the multilayer mirror surface and grazing incidence mirror surfaces. It is comparable to the roughness criterion of EUV filters.

The diffractive structure can be covered with a cap layer as for instance ruthenium provided that the thickness of this layer is uniform enough to neglect diffraction by the cap layer itself. The cap layer should be thin enough to pass the desired radiation.

When necessary, the orientation of the lines of the diffractive structure with respect to the plane created by the EUV beam can be chosen in a direction different from the direction as shown in FIG. 7.

The diffractive structure can be produced in the same ways as that of the fourth embodiment.

Common to both the fourth and fifth embodiments is that the reflective elements 300, 400, having thereon the diffractive structure, act essentially as an undisturbed reflector for desired radiation but act as a grating for undesired radiation. This is achieved by choosing a material for the diffractive structure that has a refractive index to make it as invisible as possible to the desired radiation.

While we have described above specific embodiments of the invention it will be appreciated that the invention may be practiced otherwise than described. The description is not intended to limit the invention.

What is claimed is:

1. A lithographic projection apparatus comprising:
   a radiation system to provide a projection beam of radiation;
   a support structure to support patterning structure, the patterning structure being constructed and arranged to pattern the projection beam according to a desired pattern;
   a substrate table to hold a substrate;
   a projection system to project the patterned beam onto a target portion of the substrate; and
   a grating spectral filter comprised in said radiation system for passing radiation of desired wavelengths to form said projection beam and for deflecting radiation of undesired wavelengths.

2. An apparatus according to claim 1, wherein said grating spectral filter comprises a blazed grating.

3. An apparatus according to claim 2, wherein said grating spectral filter has a blazing angle less than about 2.5°.

4. An apparatus according to claim 2, wherein said grating spectral filter has a line density in the range of from 200 to 700 lines per mm.

5. An apparatus according to claim 1, wherein said grating spectral filter is a laminar grating.

6. An apparatus according to claim 1, wherein said grating spectral filter essentially does not affect radiation of said desired wavelengths.

7. An apparatus according to claim 6, wherein said grating spectral filter is substantially formed of a material that essentially does not affect radiation of said desired wavelengths.

8. An apparatus according to claim 7, wherein said grating spectral filter is substantially formed of a material having a refractive index close to unity at said desired wavelengths.

9. An apparatus according to claim 8, wherein said grating spectral filter comprises silicon.

10. An apparatus according to claim 1, further comprising a cooling element provided in thermal contact with said grating spectral filter.

11. An apparatus according to claim 10, wherein said cooling element comprises coolant channels.

12. An apparatus according to claim 11, further comprising a cooling system for passing coolant fluid through said coolant channels.

13. An apparatus according to claim 1, wherein said grating spectral filter is a reflective filter.

14. An apparatus according to claim 1, wherein said grating spectral filter is a grazing incidence reflector.

15. An apparatus according to claim 13, wherein said grating spectral filter is integral with an optical element of said illumination system.

16. An apparatus according to claim 1, wherein said projection beam comprises extreme ultraviolet radiation.

17. An apparatus according to claim 1, wherein the extreme ultraviolet radiation has a wavelength in the range of from about 8 nm to about 20 nm.

18. An apparatus according to claim 1, wherein the extreme ultraviolet radiation has a wavelength in the range of from about 9 nm to about 16 nm.

19. An apparatus according to claim 1 wherein the support structure comprises a mask table to hold a mask.

20. An apparatus according to claim 1, wherein the radiation system comprises a radiation source.

21. An apparatus according to claim 20, wherein said radiation source is a laser-produced, or discharge, plasma radiation source.

22. A device manufacturing method comprising:
    providing a substrate that is at least partially covered by a layer of radiation-sensitive material;
    projecting a patterned beam of radiation onto a target portion of a layer of radiation-sensitive material on a substrate; and
    filtering said projection beam in said radiation system using a grating spectral filter, wherein the filtering includes forming said projection beam with passing radiation of desired wavelengths and deflecting radiation of undesired wavelengths.

23. A device manufactured in accordance with the method of claim 22.

* * * * *